United States Patent

Heuck et al.

(10) Patent No.: US 11,560,302 B2
(45) Date of Patent: Jan. 24, 2023

(54) MICROMECHANICAL PRESSURE SENSOR WITH TWO CAVITIES AND DIAPHRAGMS AND CORRESPONDING PRODUCTION METHOD

(71) Applicant: Robert Bosch GmbH, Stuttgart (DE)

(72) Inventors: Friedjof Heuck, Stuttgart (DE); Robert Maul, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 407 days.

(21) Appl. No.: 16/635,644

(22) PCT Filed: Jul. 20, 2018

(86) PCT No.: PCT/EP2018/069804
§ 371 (c)(1),
(2) Date: Jan. 31, 2020

(87) PCT Pub. No.: WO2019/025211
PCT Pub. Date: Feb. 7, 2019

(65) Prior Publication Data
US 2021/0130161 A1    May 6, 2021

(30) Foreign Application Priority Data

Aug. 2, 2017   (DE) .......................... 102017213354.6

(51) Int. Cl.
*B81B 3/00* (2006.01)
*G01L 9/00* (2006.01)
(Continued)

(52) U.S. Cl.
CPC ............ *B81B 3/0072* (2013.01); *G01L 9/008* (2013.01); *G01L 9/06* (2013.01); *G01L 13/026* (2013.01);
(Continued)

(58) Field of Classification Search
CPC .......... B81B 3/0072; B81B 2201/0264; B81B 2203/0127; G01L 9/008; G01L 9/06; G01L 13/026
See application file for complete search history.

(56) References Cited

U.S. PATENT DOCUMENTS 4,222,277 A    9/1980  Kurtz et al.
8,659,100 B2 * 2/2014  Zoellin ................ H04R 19/005
                                                257/419
(Continued)

FOREIGN PATENT DOCUMENTS

CN           1486277 A     3/2004
CN        101119924 A     2/2008
(Continued)

OTHER PUBLICATIONS

International Search Report dated Oct. 2, 2018 of the corresponding International Application PCT/EP2018/069804 filed Jul. 20, 2018.

*Primary Examiner* — Lex H Malsawma
(74) *Attorney, Agent, or Firm* — Norton Rose Fulbright US LLP; Gerard Messina

(57) ABSTRACT

In micromechanical pressure sensor device and a corresponding production method, the micromechanical pressure sensor device is provided with a first diaphragm; an adjacent first cavity; a first deformation detection device situated in and/or on the first diaphragm for detecting a deformation of the first diaphragm as a consequence of an applied external pressure change and as a consequence of an internal mechanical deformation of the pressure sensor device; a second diaphragm; an adjacent second cavity; and a second deformation detection device situated in and/or on the second diaphragm for detecting a deformation of the second diaphragm as a consequence of the internal mechanical deformation of the pressure sensor device, where the second (Continued)

diaphragm is developed in such a way that it is not deformable as a consequence of the external pressure change.

9 Claims, 3 Drawing Sheets

(51) Int. Cl.
*G01L 9/06* (2006.01)
*G01L 13/02* (2006.01)

(52) U.S. Cl.
CPC ............. *B81B 2201/0264* (2013.01); *B81B 2203/0127* (2013.01)

(56) References Cited

U.S. PATENT DOCUMENTS

| | | | | |
|---|---|---|---|---|
| 9,212,054 | B1* | 12/2015 | Kwa | B81C 1/00047 |
| 9,299,671 | B2* | 3/2016 | Liu | B81C 1/00309 |
| 2005/0082626 | A1* | 4/2005 | Leedy | H01L 23/538 |
| | | | | 257/E25.011 |
| 2009/0206422 | A1* | 8/2009 | Illing | B81C 1/00476 |
| | | | | 257/419 |

FOREIGN PATENT DOCUMENTS

| | | | | |
|---|---|---|---|---|
| CN | 102685657 | A | 9/2012 | |
| CN | 104024816 | A | 9/2014 | |
| EP | 0049955 | A1 | 4/1982 | |
| EP | 2335039 | A1 | 6/2011 | |
| EP | 2362203 | A2* | 8/2011 | ......... G01L 19/0092 |
| WO | 0153789 | A1 | 7/2001 | |
| WO | 2013152901 | A1 | 10/2013 | |

* cited by examiner

MICROMECHANICAL PRESSURE SENSOR WITH TWO CAVITIES AND DIAPHRAGMS AND CORRESPONDING PRODUCTION METHOD

CROSS-REFERENCE TO RELATED APPLICATIONS

The present application is the national stage of International Pat. App. No. PCT/EP2018/069804 filed Jul. 20, 2018, and claims priority under 35 U.S.C. § 119 to DE 10 2017 213 354.6, filed in the Federal Republic of Germany on Aug. 2, 2017, the content of each of which are incorporated herein by reference in their entireties.

FIELD OF THE INVENTION

The present invention relates to a micromechanical pressure sensor device and to a corresponding production method.

BACKGROUND

Although applicable to a wide variety of micromechanical pressure sensor devices, the present invention and the problems on which it is based are described on the basis of micromechanical pressure sensor devices on silicon bases such as those known from WO 2013/152 901 A1, for example.

FIG. 5, parts (a)-(c) show schematic illustrations of an exemplary micromechanical pressure sensor device in order to describe a problem on which the present invention is based, i.e., in a cross-section in FIG. 5, parts (a)-(b), and in a plan view in FIG. 5, part (c).

Reference sign F in FIG. 5 denotes a micromechanical function layer, e.g., a silicon layer. A diaphragm M having a cavity A disposed underneath is formed in micromechanical function layer F. Cavity A is sealed by a sealing layer V on the backside.

Reference signs P1-P4 denote a deformation detection device situated in or on diaphragm M, e.g., piezoresistive elements, for detecting a deformation of diaphragm M as a consequence of an applied external pressure change. FIG. 5, part (a) denotes the state in which external pressure P is equal to Pa, corresponding to the pressure inside cavity A. In this state, the deformation detection device having piezoresistive elements P1-P4 outputs a first measured value, e.g., via a bridge circuit. If external pressure P is raised to a higher pressure P=Pb, then diaphragm M deforms in the inward direction into cavity A, and the deformation detection device outputs a second, different measured value. This therefore makes it possible to detect the applied external pressure change.

As illustrated in FIG. 5, part (c), four piezoresistive elements P1-P4, for example, are provided on four oppositely situated edges of diaphragm M.

In the known pressure sensor device, however, mechanical deformations of diaphragm M are not exclusively attributable to the external pressure change but also to external influences that subject the micromechanical pressure sensor device to mechanical stress, e.g., deformations by mechanical tension as a result of a packaging process (not shown), by a development using a material mix that features different thermal coefficients of expansion or by the stressing of soldered joints of the developed and packaged sensor on an assembly circuit board (not shown).

Because the mechanical stress is either coupled into the pressure measurement signal in the pressure sensor device or mechanical stress relief structures lead to a reduction in the mechanical robustness, the known pressure sensors are flawed to some extent.

SUMMARY

The present invention provides a micromechanical pressure sensor device and a corresponding production method.

A micromechanical pressure sensor device and a production method according to example embodiments of the present invention make it possible to increase the accuracy of micromechanical pressure sensors. In particular, the micromechanical pressure sensor device according to the present invention allows for a development whose measured signal is insensitive to chip deformations caused by temperature changes in the environment, for example, but which simultaneously has great mechanical stability because no springs are required for the stress decoupling.

An idea on which the present invention is based is to provide an additional deformation detection device that measures only the deformation of the pressure sensor device that is caused by mechanical stress. This supplementary signal is able to be deducted from the measured signal of the actual deformation detection device so that a true measured pressure signal is able to be output that is caused only by pressure differences.

In an example embodiment, the first diaphragm and the adjacent first cavity are formed in a first micromechanical function layer, and the second diaphragm is formed in a second micromechanical function layer, which is situated at a distance from the first micromechanical function layer. This makes it possible to produce both diaphragms independently of each other.

In an example embodiment, the second micromechanical function layer is situated on a side of the first diaphragm of the first micromechanical function layer, the first diaphragm is closed, the second diaphragm has a through opening, and the second cavity is situated between the first diaphragm and the second diaphragm and fluidically communicates with the through opening. This makes it possible to place the two diaphragms in very close proximity of each other.

In an example embodiment, a spacer layer is situated between the second micromechanical function layer and the first micromechanical function layer. This makes it easy to define the second cavity via the spacer layer.

In an example embodiment, the first cavity is sealed by a sealing layer on a side of the first micromechanical function layer situated opposite the first diaphragm, the second micromechanical function layer is situated on the sealing layer, the first diaphragm is closed, the second diaphragm has a through opening, and the second cavity is situated between the second diaphragm and the sealing layer and fluidically communicates with the through opening. In this way, both diaphragms are able to be realized in an approximately symmetrical manner with respect to the first cavity.

In an example embodiment, the sealing layer has a second through opening. This makes it possible to realize two media accesses.

In an example embodiment, the first diaphragm and the adjacent first cavity are formed in a first micromechanical function layer, the second diaphragm and the adjacent second cavity in the first micromechanical function layer are laterally spaced apart from the first diaphragm and the adjacent first cavity, and the first cavity and the second cavity are sealed on a side of the first micromechanical function layer that lies opposite from the first diaphragm and the second diaphragm. In this way, both diaphragms and cavities are able to be realized in a single micromechanical function layer.

In an example embodiment, the first diaphragm is closed and the second diaphragm has a through opening. In this way, the first cavity forms a reference pressure volume.

In an example embodiment, the first deformation detection device and/or the second deformation detection device has/have one or more piezoresistive element(s). Such a deformation detection device is easy to realize.

Additional features and advantages of the present invention are described in the following text with reference to embodiments described in conjunction with the drawings in which similar reference numerals denote similar elements or elements that have the same function.

DETAILED DESCRIPTION

Figure 1:
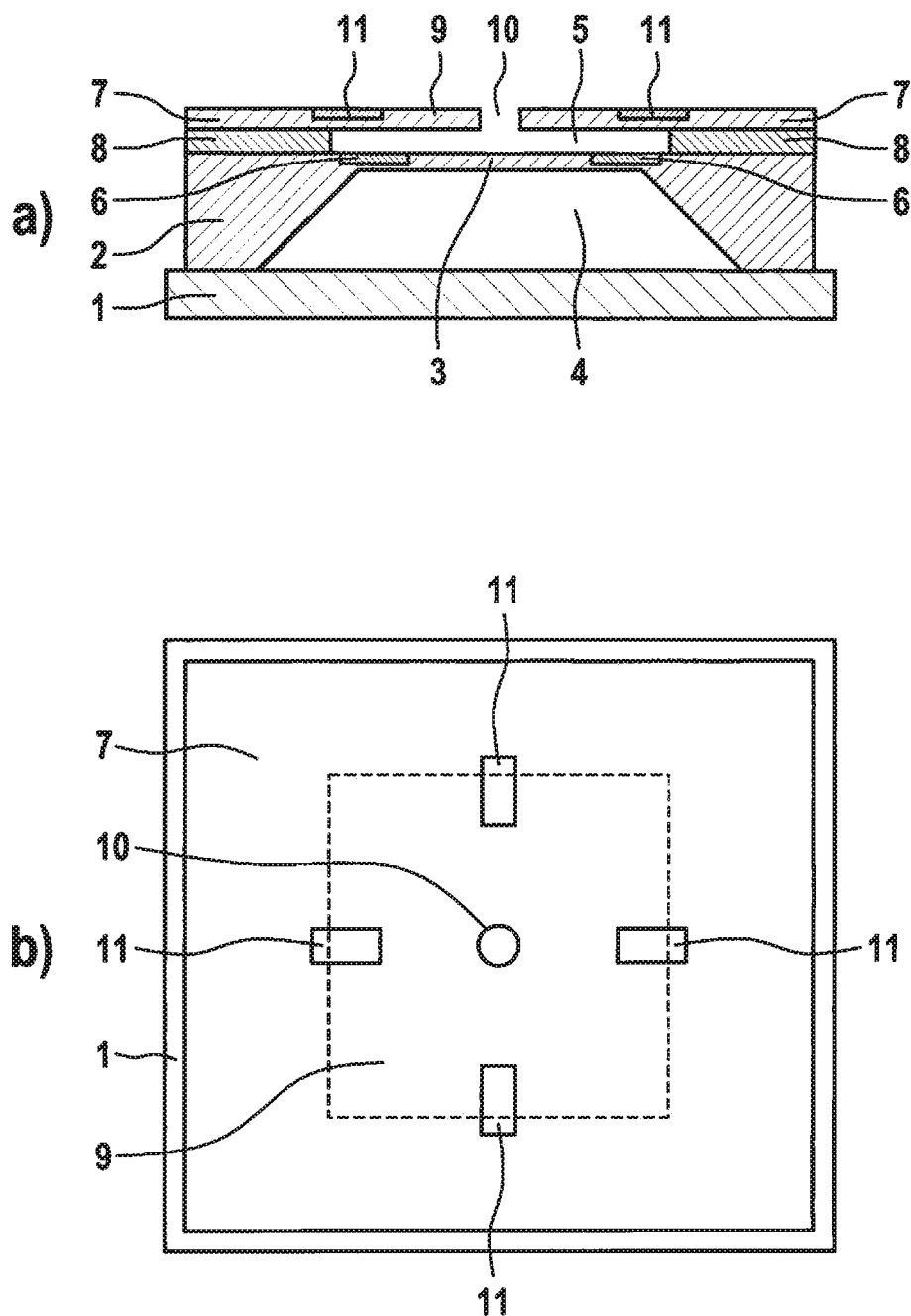
FIG. 1, parts (a) and (b) schematically represent a micromechanical pressure sensor device according to a first example embodiment of the present invention, part (a) showing it in cross-section and part (b) showing it in a plan view.

FIG. 1, parts (a) and (b) are schematic representations of a micromechanical pressure sensor device according to a first example embodiment of the present invention. A first diaphragm 3 and an adjacent cavity 4 are formed in a first micromechanical function layer 2, e.g., a silicon layer. On the side of first micromechanical function layer 2 situated opposite from diaphragm 3, a sealing layer 1 is provided, e.g., another silicon layer, which seals first cavity 4. In the present case, first diaphragm 3 is also sealed so that a constant pressure is enclosed in first cavity 4.

A first deformation detection device 6 having piezoresistive elements is provided in and/or on first diaphragm 3 and is used for detecting a deformation of first diaphragm 3 as a consequence of an applied external pressure change and as a consequence of an internal mechanical deformation of the pressure sensor device caused by stress.

Figure 5:
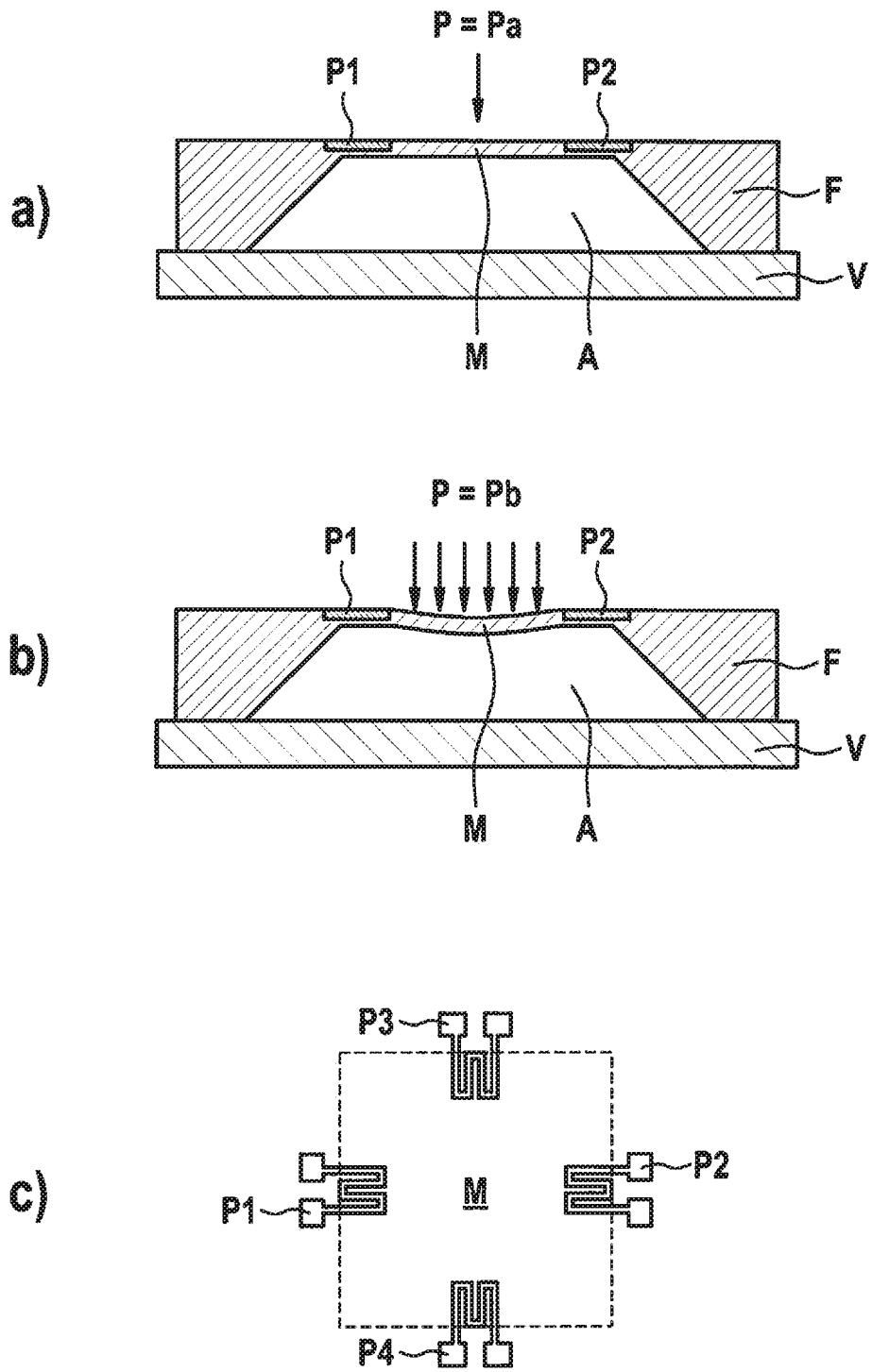
FIG. 5, parts (a)-(c) schematically represent an exemplary micromechanical pressure sensor device in order to describe a problem on which the present invention is based, parts (a) and (b) showing it in cross-section and part (c) showing it in a plan view.

The measurement of the deformation via deformation detection device 6 is performed as described in connection with FIG. 5, parts (a)-(c) such as via a bridge circuit (not shown).

Situated on top of first micromechanical function layer 2 is a second micromechanical function layer 7, e.g., a further silicon layer, which is connected to first micromechanical function layer 2 via a spacer layer 8. Situated within second micromechanical function layer 7 and above first diaphragm 3 is a second diaphragm 9, which has a through opening 10.

A second cavity 5 is developed between first diaphragm 3 and second diaphragm 9. A second deformation detection device 11 having piezoresistive elements is situated in and/or on second diaphragm 9, which is used for detecting a deformation of second diaphragm 9 due to the internal mechanical deformation of the pressure sensor device. Diaphragm 9 is developed in such a way that it is not deformable as a consequence of the external pressure change. In particular, through opening 10 allows for a pressure equalization between first cavity 4 and second cavity 5.

Using the described setup, first deformation detection device 5 supplies a first measured signal, which is proportional to the external pressure and proportional to internal mechanical deformations of the pressure sensor device. In addition, second deformation detection device 11 supplies a second measured signal, which is proportional only to a deformation of the second diaphragm as a consequence of the internal mechanical deformation of the pressure sensor device. If the second measured signal is subtracted from the first measured signal, then a corrected measured signal is obtained, which is proportional only to the external pressure.

The elimination of the undesired interference component, e.g., caused by stress tensions, as a consequence of internal mechanical deformations functions even more precisely if the deformation of the pressure sensor device is the same at the positions of the piezoresistive elements of first deformation detection device 6 and at the positions of the piezoresistive elements of second deformation detection device 11, which is why the corresponding piezoresistive elements should be placed next to one another as closely as possible.

Figure 2:
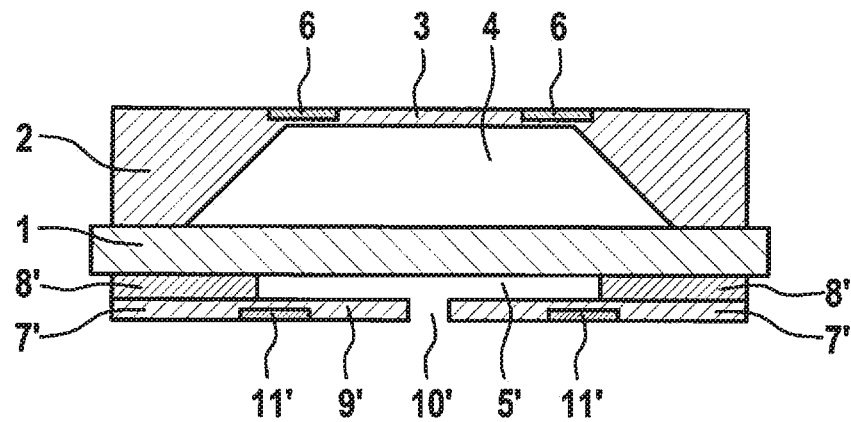
FIG. 2 is a schematic cross-sectional representation of a micromechanical pressure sensor device according to a second example embodiment of the present invention.

FIG. 2 shows a schematic cross-sectional representation of a micromechanical pressure sensor device according to a second example embodiment of the present invention, in which the setup of first micromechanical function layer 2, first diaphragm 3, first cavity 4, and first deformation detection device 6 corresponds to the setup already described with reference to FIG. 1.

In contrast to the first example embodiment, in the second example embodiment, second micromechanical function layer 7' is provided above a spacer layer 8', which is situated on sealing layer 1 that is connected to first micromechanical function layer 2 on the side situated opposite first diaphragm 3.

Second diaphragm 9' has a second deformation detection device 11' having piezoresistive elements, and a second cavity 5' is provided between second diaphragm 9' and sealing layer 1.

The methods of functioning of first deformation detection device 6 and second deformation detection device 11' are similar to the method of functioning of the afore-described first deformation detection device 6 and second deformation detection device 11. In the same way as in the first example embodiment, a through opening 10' is provided in second diaphragm 9', which provides for a pressure equalization so that second deformation detection device 11' detects only a deformation of second diaphragm 9' as a consequence of the internal mechanical deformation of the pressure sensor device.

Figure 3:
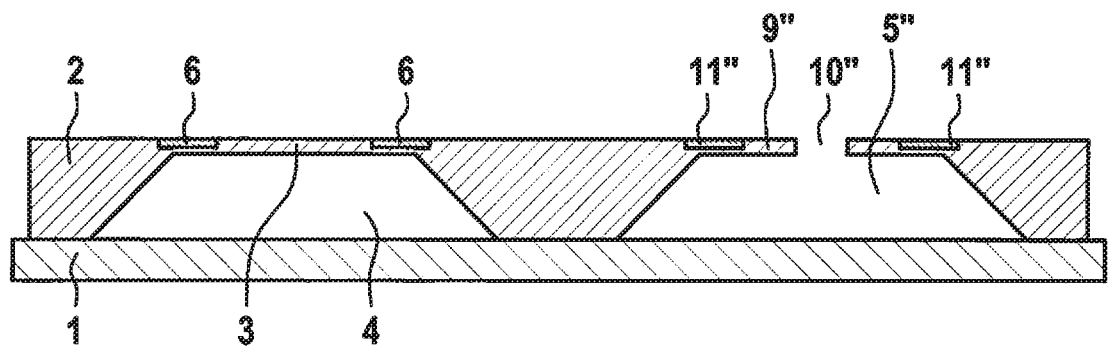
FIG. 3 is a schematic cross-sectional representation of a micromechanical pressure sensor device according to a third example embodiment of the present invention.

FIG. 3 is a schematic cross-sectional representation of a micromechanical pressure sensor device according to a third example embodiment of the present invention, in which a single micromechanical function layer 2 is provided into which first diaphragm 3 and a first cavity 4 situated underneath as well as second diaphragm 9" with second cavity 5" situated underneath are integrated.

First diaphragm 3 has a first deformation detection device 6, and second diaphragm 9" has second deformation detection device 11". Second diaphragm 9" has a through opening 10" so that it is sensitive only to deformations caused by internal mechanical stress and is not sensitive to external pressure differences. Both cavities 4, 5" are sealed by sealing layer 1 on the side situated opposite diaphragms 3, 9".

Here, too, the method of functioning of first deformation detection device 6 and second deformation detection device 11" is the same as the function of first deformation detection device 6 and second deformation detection device 11 of the first embodiment.

In the third example embodiment, no second micromechanical function layer is required and no spacer layer either. As a result, this third example embodiment is more cost-effective than the first and second example embodiments. Since second deformation detection device 11" including the piezoresistive elements is spatially separated to a greater extent from first deformation detection device 6 having the piezoresistive elements, the elimination of the interference signal is slightly less precise, which, however, is not critical for special applications that make fewer demands.

Figure 4:
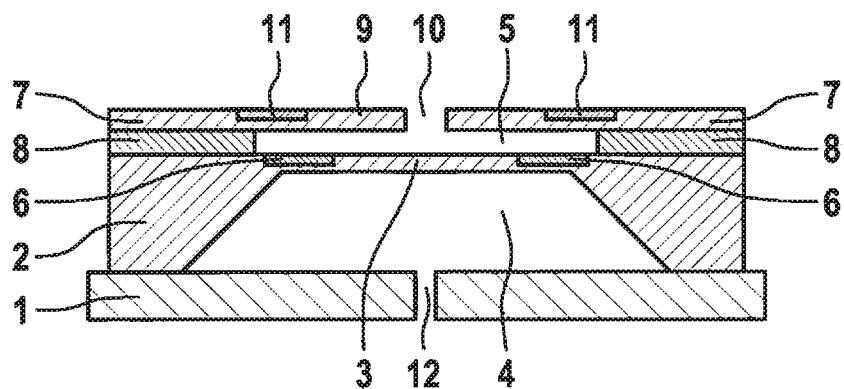
FIG. 4 is a schematic cross-sectional representation of a micromechanical pressure sensor device according to a fourth example embodiment of the present invention.

FIG. 4 is a schematic cross-sectional representation of a micromechanical pressure sensor device according to a fourth example embodiment of the present invention that corresponds to the setup of the first example embodiment. In the fourth example embodiment, a further through opening 12 is provided in the sealing layer so that the corresponding pressure sensor device is a differential-pressure pressure sensor device which includes two media accesses in the form of the two through openings 10, 12, and no constant pressure is enclosed in first cavity 4.

In all other respects, the method of functioning of the fourth embodiment is similar to the method of functioning of the first example embodiment described in the previous text.

Although the present invention has been described on the basis of preferred example embodiments, it is not restricted to these embodiments. In particular, the mentioned materials and topologies are merely of an exemplary nature and not restricted to the described examples.

Although one or more piezoresistive element(s) is/are provided as a deformation detection device in the afore-described example embodiments, the present invention is not restricted to these but can basically be used for a wide variety of deformation detection devices. In addition, the illustrated geometries and materials are exemplary and not restricted to the mentioned examples.

What is claimed is:

1. A micromechanical pressure sensor device comprising:
a first cavity;
a first diaphragm that is adjacent to the first cavity and that is deformable, to produce a deformation of the first diaphragm, by an applied external pressure change and by an internal mechanical deformation of the pressure sensor device;
a first deformation detection device situated in and/or on the first diaphragm, wherein the first deformation detection device is configured to detect the deformation of the first diaphragm;
a second cavity;
a second diaphragm that is adjacent to the second cavity and that is deformable, to produce a deformation of the second diaphragm, by the internal mechanical deformation of the pressure sensor device, but not by the applied external pressure change; and
a second deformation detection device situated in and/or on the second diaphragm, wherein the second deformation detection device is configured to detect the deformation of the second diaphragm,
wherein the first diaphragm and the first cavity are formed in a first micromechanical function layer of the micromechanical pressure sensor device, and the second diaphragm is formed in a second micromechanical function layer of the micromechanical pressure sensor device, the second micromechanical function layer being situated at a distance from the first micromechanical function layer.

2. The micromechanical pressure sensor device of claim 1, wherein the second micromechanical function layer is situated at one side of the first diaphragm, the first diaphragm is closed, the second diaphragm has a through opening, and the second cavity is situated between the first diaphragm and the second diaphragm and fluidically communicates with the through opening.

3. The micromechanical pressure sensor device of claim 1, further comprising a spacer layer arranged between the first and second micromechanical function layers.

4. The micromechanical pressure sensor device of claim 1, further comprising a sealing layer that seals the first cavity on a side of the first micromechanical function layer situated opposite the first diaphragm, such that the second micromechanical function layer is situated on a first side of the sealing layer, wherein the first diaphragm is closed, the second diaphragm has a through opening, and the second cavity is situated between the second diaphragm and the sealing layer and fluidically communicates with the through opening.

5. The micromechanical pressure sensor device of claim 1, further comprising a cap layer on the first cavity on a side of the first micromechanical function layer situated opposite the first diaphragm, wherein the second micromechanical function layer is situated at one side of the sealing layer, the first diaphragm is closed, the second diaphragm has a first through opening, the second cavity fluidically communicates with the first through opening, and the sealing layer has a second through opening.

6. The micromechanical pressure sensor device of claim 1, wherein the first deformation detection device and/or the second deformation detection device has one or more piezoresistive elements.

7. A micromechanical pressure sensor device comprising:
a first cavity;
a first diaphragm that is adjacent to the first cavity and that is deformable, to produce a deformation of the first diaphragm, by an applied external pressure change and by an internal mechanical deformation of the pressure sensor device;
a first deformation detection device situated in and/or on the first diaphragm, wherein the first deformation detection device is configured to detect the deformation of the first diaphragm;
a second cavity;
a second diaphragm that is adjacent to the second cavity and that is deformable, to produce a deformation of the second diaphragm, by the internal mechanical deformation of the pressure sensor device, but not by the applied external pressure change; and
a second deformation detection device situated in and/or on the second diaphragm, wherein the second deformation detection device is configured to detect the deformation of the second diaphragm,
wherein:
the first diaphragm and the first cavity are formed in a first micromechanical function layer;

the second diaphragm and the second cavity are formed in the first micromechanical function layer, laterally spaced apart from the first diaphragm and the first cavity; and the first cavity and the second cavity are sealed on a side of the first micromechanical function layer that lies opposite the first diaphragm and the second diaphragm, wherein the first diaphragm is closed and the second diaphragm has a through opening.

8. A method for producing a micromechanical pressure sensor device, the method comprising:

arranging a first diaphragm, that is deformable to produce a deformation of the first diaphragm by an applied external pressure change and by an internal mechanical deformation of the pressure sensor device, adjacent to a first cavity;

arranging a first deformation detection device in and/or on the first diaphragm wherein the first deformation detection device is configured to detect the deformation of the first diaphragm;

arranging adjacent to a second cavity a second diaphragm that is deformable to produce a deformation of the second diaphragm by the internal mechanical deformation of the pressure sensor device, but not by the applied external pressure change; and arranging a second deformation detection device in and/or on the second diaphragm, wherein the second deformation detection device is configured to detect the deformation of the second diaphragm, wherein the first diaphragm and the first cavity are formed in a first micromechanical function layer of the micromechanical pressure sensor device, and the second diaphragm is formed in a second micromechanical function layer of the micromechanical pressure sensor device, the second micromechanical function layer being situated at a distance from the first micromechanical function layer.

9. A method for producing a micromechanical pressure sensor device, the method comprising:

arranging a first diaphragm, that is deformable to produce a deformation of the first diaphragm by an applied external pressure change and by an internal mechanical deformation of the pressure sensor device, adjacent to a first cavity;

arranging a first deformation detection device in and/or on the first diaphragm wherein the first deformation detection device is configured to detect the deformation of the first diaphragm;

arranging adjacent to a second cavity a second diaphragm that is deformable to produce a deformation of the second diaphragm by the internal mechanical deformation of the pressure sensor device, but not by the applied external pressure change; and arranging a second deformation detection device in and/or on the second diaphragm, wherein the second deformation detection device is configured to detect the deformation of the second diaphragm, wherein:

the first diaphragm and the first cavity are formed in a first micromechanical function layer;

the second diaphragm and the second cavity are formed in the first micromechanical function layer, laterally spaced apart from the first diaphragm and the first cavity; and the first cavity and the second cavity are sealed on a side of the first micromechanical function layer that lies opposite the first diaphragm and the second diaphragm, wherein the first diaphragm is closed and the second diaphragm has a through opening.

* * * * *